United States Patent
Boury et al.

(10) Patent No.: US 12,216,174 B2
(45) Date of Patent: Feb. 4, 2025

(54) CURRENT SENSOR DEVICE

(71) Applicant: Melexis Technologies SA, Bevaix (CH)

(72) Inventors: Bruno Boury, Tessenderlo (BE);
Asparuh Grigorov, Sofia (BG);
Stephane Rauw, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 130 days.

(21) Appl. No.: 18/148,099

(22) Filed: Dec. 29, 2022

(65) Prior Publication Data
US 2023/0204682 A1    Jun. 29, 2023

(30) Foreign Application Priority Data
Dec. 29, 2021   (EP) .................................... 21218046

(51) Int. Cl.
*G01R 31/392*   (2019.01)
*G01R 15/20*   (2006.01)
(Continued)

(52) U.S. Cl.
CPC ......... *G01R 31/392* (2019.01); *G01R 15/202* (2013.01); *G01R 19/1659* (2013.01); *G01R 31/3832* (2019.01)

(58) Field of Classification Search
None
See application file for complete search history.

(56) References Cited

U.S. PATENT DOCUMENTS 11,169,218 B2    11/2021  Wan et al.
2001/0040446 A1*  11/2001  Lapinksi ............... G01R 15/142
                                                  324/126
(Continued)

FOREIGN PATENT DOCUMENTS

EP    2746890 A1    6/2014
EP    3306765 A1    4/2018
(Continued)

OTHER PUBLICATIONS

Extended European Search Report for EP Application No. 21218046.7, Jul. 8, 2022.

*Primary Examiner* — Jas A Sanghera
(74) *Attorney, Agent, or Firm* — Workman Nydegger (57) ABSTRACT

A current sensor device for measuring a current in a conductor comprising: current sensing means comprising a magnetic sensing element for contactlessly measuring the current; amplification means arranged to act in a first and second state, said amplification means in said first and second state being arranged for amplifying a first and second signal, respectively, from said current sensing means with an adjustable first gain and a second gain and a first and second bandwidth to yield a first and second amplified signal, respectively, wherein said first gain is higher than the second gain, wherein the first gain and the second gain are larger than 1; processing means for controlling at least said first gain, for detecting an event based on at least said second amplified signal and for producing a signal indicative of said event; an output terminal arranged for outputting a signal indicative of said current based on said first amplified signal; and an output terminal arranged for outputting said signal indicative of the event.

17 Claims, 3 Drawing Sheets

(51) Int. Cl.
    *G01R 19/165*     (2006.01)
    *G01R 31/3832*     (2019.01)

(56) References Cited

U.S. PATENT DOCUMENTS

| | | | | |
|---|---|---|---|---|
| 2006/0181284 A1* | 8/2006 | Fraedrich | ............. | G01R 31/083 |
| | | | | 324/543 |
| 2008/0157751 A1* | 7/2008 | Jones | ................. | G01R 15/185 |
| | | | | 324/127 |
| 2013/0335069 A1* | 12/2013 | Vig | ................. | G01R 33/0035 |
| | | | | 324/207.12 |
| 2014/0320145 A1* | 10/2014 | Johnson | ............. | G01R 13/0236 |
| | | | | 324/436 |
| 2015/0022187 A1* | 1/2015 | Taylor | ................. | G01R 33/06 |
| | | | | 324/207.13 |

FOREIGN PATENT DOCUMENTS

| | | |
|---|---|---|
| EP | 2815244 B1 | 8/2020 |
| WO | 2013/015197 A1 | 10/2013 |

* cited by examiner

CURRENT SENSOR DEVICE

TECHNICAL FIELD OF THE INVENTION

The present invention relates to the field of current sensor devices.

BACKGROUND OF THE INVENTION

Current sensor devices are widely used in the field of electronics to determine a current on a line, i.e., conductor. From the current, events, such as an overcurrent event, may be determined. In the state of the art, detection of such an event is often performed by comparing, typically using an analog comparator, the output signal of the current sensor, indicative of the current, to a predetermined threshold. Whenever the output signal reaches the predetermined threshold, a signal indicative of the event is generated.

The present trend of ever-increasing electrification brings new challenges. In some applications, such as electric vehicles, the current must be accurately controlled, which requires accurate monitoring of the current generated by the battery of the electric vehicle or supplied to the electric motor. At the same time, events such as overcurrents may be particularly problematic for safety reasons, because of the volume and power of batteries of electrical vehicles. Therefore, such events need to be solved as fast as possible, which requires very fast detection of these events.

There is, thus, still a need in the art for a current sensor device that solves at least one of the above problems.

SUMMARY OF THE INVENTION

It is an object of the present invention to provide a good current sensor device.

The above objective is accomplished by a method and apparatus according to the present invention.

It is an advantage of embodiments of the present invention that the current sensor device may have a high precision on an output signal indicative of a detected current. It is a further advantage of embodiments of the present invention that, simultaneously, a fast detection of an event is possible.

In a first aspect, the present invention relates to a current sensor device for measuring a current in a conductor. The current sensor device comprises current sensing means comprising a magnetic sensing element for contactlessly measuring the current. The current sensor device further comprises amplification means arranged to act in a first state and in a second state. The amplification means in said first state are arranged for amplifying a first signal from said current sensing means with an adjustable first gain and a first bandwidth to yield a first amplified signal. The amplification means in said second state are arranged for amplifying a second signal from said current sensing means with a second gain and a second bandwidth, yielding a second amplified signal. Herein, the first gain is higher than the second gain. The first gain and the second gain are larger than 1. The current sensor device further comprises processing means arranged for receiving said first and said second amplified signal, for controlling at least said first gain, and for detecting an event based on at least said second amplified signal and for producing a signal indicative of said event. The current sensor device further comprises an output terminal arranged for outputting a signal indicative of said current based on said first amplified signal, and an output terminal arranged for outputting said signal indicative of the event.

It is an advantage of embodiments of the present invention that, by separately processing the signal from the sensing means for the signal indicative of the current, and for the signal indicative of an event, different, possibly opposing, requirements on the processed signals may be met. Typically, achieving a high precision on a signal indicative of a detected current is at the cost of the rate at which the signal may be detected. The present invention enables both fast detection of the event, and a high precision on a signal indicative of a detected current.

In embodiments, the first gain is at least 10, preferably at least 50. In embodiments, the adjustable first gain may be set to a value of from 10 to 100.000, preferably from 50 to 20.000. In embodiments, the second gain, that is preferably a fixed gain, may be set to, e.g., fixed at, a value of from 1.5 to 50, preferably from 2 to 30. Preferably, the first gain is adjustable in a range of values that does not overlap with a range of values to which the second gain may be set, e.g., with a fixed value for the second gain. It is an advantage of these embodiments that the first and second amplified signal may be easily processed by the processing means, even though the magnetic sensing element is used that may provide a small first signal and a small second signal.

In embodiments, a ratio of a voltage of the conductor in which the current is measured to a maximum operation voltage of the current sensor device is at least 2, or at least 10, or at least 100.

In embodiments, the current sensor device may be an integrated current sensor device, for example an integrated single semiconductor chip, such as a semiconductor chip, e.g., a packaged CMOS integrated circuit. In these embodiments, each of the components of the current sensor device may be integrated on the same chip.

In embodiments, the processing means is arranged for detecting the first amplified signal, and for controlling at least said first gain based on the detected first amplified signal. In order to achieve a high precision on the output of the sensing, the first gain may be changed a number of times before a sufficient, optimized, gain is determined. To arrive at the optimized gain, the processing means may compare the first amplified signal with a reference signal, e.g., a predetermined threshold. In embodiments, said reference signal may be indicative of a saturation of a detecting means for detecting the first amplified signal (e.g., of an analog-to-digital converter). In alternative embodiments, said reference signal may be representative of a full scale, i.e., maximum output, of the amplifying means in the first state. As one example, the first gain is initially set at a first, high value. The first amplified signal is then compared to a, single, reference signal. When the first amplified signal is above the reference signal, the processing means may set the first gain to a second value lower than the first value. This algorithm (of said comparing and reducing of the gain) may be repeated until the first amplified signal is lower than the reference signal. When the first amplified signal is lower than the reference signal, the signal indicative of the current may be generated and/or outputted. It is an advantage of these embodiments that any detection means for detecting the first amplified signal, and possibly of the signal indicative of the current based on said first amplified signal, may not result in a saturation of the detection means. It will be clear to the person skilled in the art that this is an example only, and different algorithms may be used instead. For example, alternatively, the first gain may initially be set to a low value, the first amplified signal may be compared to a reference signal, and the first gain may be increased until the reference signal is reached. However, preferably, the first gain is initially set to a maximum value, as it may be assumed that the current to be monitored is lowest at start-up of, e.g., the electrical vehicle.

In preferred embodiments, the processing means may compare the first amplified signal with a first, high, reference signal and with a second, low, reference signal. For example, the first reference signal may be a predetermined threshold signal that is from 70% to 90% of the full scale of the first state of the amplifying means, and the second reference signal may be a predetermined threshold signal that is from 10% to 30% of the full scale of the first state of the amplifying means. If the first amplified signal is above the first reference signal, the first gain may be reduced. If the first amplified signal is below the second reference signal, the first gain may be increased. If the first amplified signal is between the first and second gain, the first gain may be kept constant.

In combination with, or alternatively from, embodiments wherein the first amplified signal is compared with the at least one reference signal, in embodiments, a derivative may be determined of the first amplified signal, and compared to at least one predetermined threshold for the derivative. For example, if the determined derivative is above a first, positive, predetermined threshold for the derivative, implying that the detected current is increasing, it may be predicted that the first gain may have to be decreased. Said first gain may accordingly be decreased, e.g., so as to keep the first amplified signal in-between the first, low, reference signal and the second, high, reference signal discussed above. Accordingly, if the determined derivative is below a second, negative, predetermined threshold for the derivative, implying that the detected current is decreasing, it may be predicted that the first gain may have to be increased. Said first gain may accordingly be increased, e.g., so as to keep the first amplified signal in-between the first, low, reference signal and the second, high, reference signal discussed above. In a preferred embodiment, the first amplified signal is compared to the first, low, reference signal, the second, high, reference signal, the first positive predetermined threshold for the derivative, and the second negative predetermined threshold for the derivative.

The above algorithms for tuning the first gain may advantageously result in a very accurate determination of the current. As the detection of the event occurs separately, and may not be slowed by such an algorithm, detection of the event may still be fast.

As such, the first amplified signal may be continuously tracked, and the first gain may be tuned so as to optimize the first amplified signal. In embodiments, the first gain is increased and/or decreased in gain steps (i.e., discontinuously), which may result in a fast optimization of the first gain. In other words, in embodiments, a plurality of discrete gain values for the first gain is used. Said plurality of discrete gain values for the first gain may be implemented by using, for example, different resistor or capacitor values in a negative feedback loop of an amplifier. The first gain is adapted by selecting which resistor or capacitor value is connected in the negative feedback loop of the amplifier.

In embodiments, the second gain has a fixed, predetermined value. Adapting a gain may take time and slow down detection. Detection of an event often requires detecting whether the current is larger than a fixed, predetermined threshold. A fixed, predetermined value for the second gain may, therefore, be suitable, and result in a fast detection of the gain. Furthermore, the second gain is typically set low so that saturation of detector means or of the amplifying means in the second state may be avoided when, e.g., an overcurrent event occurs.

In embodiments, the current sensor device comprises means for time-division multiplexing the first amplified signal and the second amplified signal. It is an advantage of these embodiments that at least some components of the current sensor device may be used for generating, processing, and/or outputting of both the first amplified signal and the second amplified signal.

In embodiments, the processing means comprises a switch, having a first input for receiving the first amplified signal and a second input for receiving the second amplified signal, wherein the switch is arranged for selecting between the first amplified signal and the second amplified signal for outputting from a single output of the switch.

In embodiments, the amplification means comprises a single amplifier, that is arranged to switch between the first state and the second state. For example, the processing means may be arranged to switch the single amplifier between the first state, such that the amplifier applies the first gain, and the second state, such that the amplifier applies the second gain.

In different embodiments, the amplification means comprises a first amplifier arranged to act in the first state and a second amplifier, different from the first amplifier, to act in the second state. In these embodiments, the first amplified signal and the second amplified signal may be generated simultaneously. Furthermore, as each state is served by a dedicated amplifier, the stability of the first and second amplified signal may be increased.

In embodiments, the event is a fault. Said fault may be selected from: an overcurrent, a short-circuit, an open-circuit, a defect in a subsystem, or a defect in a battery. In embodiments, the event is an overcurrent event. For example, the second amplified signal may be compared to a predetermined threshold indicative of the event, based on which the event, e.g., the overcurrent event, may be detected. An overcurrent event may require a fast response to solve the event, to prevent damage that may occur when the overcurrent event remains unhandled. The present invention is particularly well suited to facilitate such a fast response. Still other events may be detected as well, such as detection of an integral and/or a derivative of the current higher than a predetermined value, a predetermined spectral signature in the current, or a predetermined waveform pattern in the current, may be determined as well. For example, the event may be a sudden increase that is too high to be considered normal, such as a derivative of the current that is greater than a threshold. The event may be that the current was too high for a certain duration, i.e., the integral of current samples is above a threshold. The event may be a current signature indicative of a defect in a subsystem of the car, and identified using a correlation function with a predetermined data pattern, or in the frequency domain using a Fast Fourier transform (FFT). The event may be that the current drops to 0. However, also other (non-fault) events may be detected, such as acceleration or deceleration of an electrical motor electrically coupled to the battery, a subsystem that is connected to the battery that is turned on or off, or that the car itself is turned on/off.

The event that is detected may be selectable from a list of events. As an example, the processing means may be configured for selecting an event from said list (and a corresponding, e.g., threshold value for the second amplified signal or for a derivative thereof, or a spectral signature or waveform pattern for the second amplified signal), as a function of a speed or a state of the car, wherein the state may be selected from, e.g., the car being parked or driving. For example, two or more different current thresholds may be selected as a function of a state of the car, or a speed of the car.

In embodiments, the first amplified signal may be compared to multiple signatures, so as to identify a pattern in the current, e.g., current spikes, a ripple, or an exponential increase of the current. Said signature may, for example, be a threshold that may be exceeded, a frequency that may be present, an exponential increase, or a pattern that may be identified in the first amplified signal. For example, the derivative of the first amplified signal may be compared to a first threshold, and the magnitude of the first amplified signal may be compared to a second threshold. Herein, the multiple signatures, i.e., the pattern determined in the first amplified signal, may be indicative of the event, e.g., the fault.

The current sensing means comprises a magnetic sensing element, preferably a Hall sensor, which may comprise a vertical or a horizontal Hall plate. Alternatively, the magnetic sensing element may comprise a magnetoresistance element, for example an anisotropic magneto-resistance element, a giant-magneto-resistance element, or a tunnelling junction magneto-resistance element, which may be arranged in a Wheatstone bridge configuration. It is an advantage of these embodiments that the current may be detected accurately and without contacting a wire through which the current flows. In these embodiments, the current sensing means typically further comprises a voltage sensing means for detecting a voltage, e.g., over a Hall plate perpendicular to a biasing current through said Hall plate. As such, the first and/or second signal may be the voltage over the Hall plate perpendicular to the biasing current through said Hall plate. In embodiments, the current sensing means comprises a shunt resistor for generating a voltage drop. In these embodiments, the current sensing means typically further comprises a voltage sensing means for detecting said voltage drop for determining the current. Either the first signal or the second signal may be the voltage detected by the voltage sensing means, or may be based thereon.

In embodiments, the current sensing means comprises one or more current sensing elements for providing said first and second signal, wherein the first and second signal are the same signal. In these embodiments, when there is more than one current sensing element, the more than one current sensing elements may be connected in parallel to generate a single signal, that is both the first and the second signal.

In different embodiments, the current sensing means comprises a first current sensing element and a second current sensing element, different from the first current sensing element, wherein the first current sensing element is for outputting the first signal, and wherein the second current sensing element is for outputting the second signal.

In these embodiments, the second current sensing element may comprise a Hall sensor, arranged such that two terminals are fixedly used for biasing, and two different terminals are fixedly used for readout. Preferably, a direction of the biasing current is fixed. It is an advantage of these embodiments that detection of the event may not be slowed by rotation or switching of the biasing and readout between different terminals.

In embodiments, the processing means comprises at least one analog-to-digital converter for converting the first and second amplified signal into a first and second digital signal, respectively, and digital signal processing circuitry for the controlling of at least said first gain, for the detecting of the event and for the producing of the signal indicative of said event. It is an advantage of embodiments of the present invention that the first gain may be tuned such that no saturation of the analog-to-digital converter, when converting the first amplified signal, may occur. It is an advantage of embodiments of the present invention that the second gain may be set such that no saturation of the analog-to-digital converter, when converting the second amplified signal, may occur.

In embodiments comprising the analog-to-digital converter, the first digital signal may be the signal indicative of the current that is subsequently outputted by one of the output terminals. In these embodiments, also information on the first gain may be outputted, which may be a digital signal outputted at the same output terminal as where the signal indicative of the current is outputted. This may be advantageous, as the first amplified signal and, hence, the first digital signal typically depends on the first gain. In preferred embodiments, the first digital signal is further processed by the digital signal processing circuitry so as to obtain said signal indicative of the current. For example, the signal indicative of the current may be generated based on the first gain and on the first digital signal. This may be preferred, as no further output signal indicative of the first gain may have to be outputted.

In embodiments comprising the analog-to-digital converter, the digital signal processing circuitry may compare the second digital signal with a reference value, indicative for whether the event occurred, so as to detect the event. In embodiments, depending on the comparison, the digital signal processing circuitry may produce, when an event occurred, the signal indicative of said event and/or produce, when no event occurred, a signal indicative that no event occurred.

In embodiments, the processing means comprises an analog comparator. In these embodiments, the analog comparator may comprise a high-gain differential amplifier. Typically, the output signal of the analog comparator is a binary signal. For example, the second amplified signal is inputted in a first input (e.g., $V_+$) of the differential amplifier. A reference signal, that is a threshold value indicative for whether the event occurred, is inputted in a second input (e.g., V.) of the differential amplifier. An output ($V_O$) of the analog comparator may be a low signal when no event occurs (i.e., when the second amplified signal is below the reference signal), and a high signal when the event occurs (i.e., when the second amplified signal is above the reference signal). However, the skilled person will realize that, equally, an inverted configuration could be used, that is, wherein the reference signal is inputted in the first input, and the second amplified signal is inputted in the second input, of the differential amplifier.

In embodiments, the second bandwidth is higher than the first bandwidth. In embodiments, a ratio of the second bandwidth to the first bandwidth is at least 2, preferably at least 10, more preferably at least 100. It is an advantage of these embodiments that detection of the event may be fast. It is a further advantage of these embodiments that the first signal may be further filtered by the (lower) first bandwidth, which may reduce a noise in the first signal, and may prevent anti-aliasing, which may be particularly relevant when the first amplified signal is inputted into an analog-to-digital converter. For example, an amplifier used for the amplification means in the second state may have a higher bandwidth than a different amplifier used for the amplification means in the first state. As another example, stronger negative feedback may be applied to the amplifier when the amplification means acts in the second state than when the amplification means acts in the first state.

Any features of any embodiment of the first aspect may be independently as correspondingly described for any embodiment of the second aspect or the third aspect of the present invention.

In a second aspect, the present invention relates to a system comprising:

the current sensor device according to embodiments of the first aspect of the present invention, configured for measuring a current in a conductor, and the conductor.

In embodiments, a ratio of a voltage of the conductor in which the current is measured to a maximum operation voltage, e.g., a maximum supply voltage or a maximum input voltage, of the current sensor device is at least 2, or at least 10, or at least 100. It is an advantage of embodiments of the present invention that, as the current sensor device comprises the magnetic sensing elements for contactlessly measuring the current, the current through a conductor that is at a very high voltage, e.g., at least 24V, or at least 60V, or at least 400V, or at least 800V, may be measured without damaging the current sensor device. In embodiments, the maximum operation voltage of the current sensor device may be at most 3.3V, or at most 5V, or at most 12V. For example, the supply voltage of the current sensor device or a voltage at an input terminal of the current sensor device may not exceed the maximum operation voltage. This is typically the case when the current sensor device is a semiconductor integrated device. In case of such a difference in voltage between the conductor and the maximum operation voltage of the current sensor device, when detecting the current in the conductor in electrical contact with the current sensor device (instead of contactlessly), the voltage in the conductor may damage the current sensor device.

In embodiments, the system further comprises a battery, wherein the conductor is electrically connected to the battery.

Any features of any embodiment of the second aspect may be independently as correspondingly described for any embodiment of the first or fourth aspect of the present invention.

In a third aspect, the present invention relates to a use of the current sensor device according to embodiments of the first aspect, for monitoring of a current generated by a battery. It is an advantage of embodiments of the present invention that the current sensor device may both provide an accurate detection of the current generated by the battery, and a fast detection of an overcurrent event of the battery.

In a fourth aspect, the present invention relates to a current sensor device comprising current sensing means for measuring a current, comprising a first Hall sensor and a second Hall sensor. The first Hall sensor is arranged such that a direction of a biasing current applied to a Hall plate of the first Hall sensor is alternated between at least two different directions. For example, in the state of the art, two-phase current spinning, wherein the direction of the biasing current is inverted, is often used. Furthermore, also often used is four-phase spinning, wherein the functions of the two biasing and two sensing terminals of the Hall sensor are swapped. In a horizontal Hall sensor, this may be implemented such that the biasing direction may be changed between four directions oriented at 90° angle intervals with respect to each other. Herein, a voltage for readout of the first Hall sensor is typically detected in a direction perpendicular to the direction of the applied biasing current. In a vertical Hall sensor, wherein the terminals are typically connected along a straight line with a vertical Hall plate, current-spinning may also be achieved by swapping the terminals and the direction of the current through the vertical Hall plate. The second Hall sensor is arranged such that two terminals are fixedly used for current biasing, and two different terminals are fixedly used for readout. Preferably, the direction of the current is fixed, e.g., by a fixed voltage source. In other words, typically, in embodiments of the fourth aspect, no current spinning is used for the second Hall sensor. The current sensor device further comprises amplification means arranged to act in a first state and in a second state. The amplification means in said first state are arranged for amplifying a first signal from the first Hall sensor of said current sensing means with a first gain and a first bandwidth to yield a first amplified signal. Herein, the first gain may or may not be tuneable. The amplification means in said second state are arranged for amplifying a second signal from the second Hall sensor of said current sensing means with a second gain and a second bandwidth, yielding a second amplified signal. The current sensor device further comprises processing means arranged for receiving said first and said second amplified signal, for detecting an event based on at least said second amplified signal and for producing a signal indicative of said event. The current sensor device further comprises an output terminal arranged for outputting a signal indicative of said current based on said first amplified signal, and an output terminal arranged for outputting said signal indicative of the event.

Said at least two directions are typically located in a plane of the Hall plate, and may be orientated at regular angle intervals with respect to each other. For example, the at least two directions may comprise two opposite directions, or, in the case of a horizontal Hall plate, four directions oriented at 90° angles. An advantage of said alternating of the direction of the biasing current through the Hall plate is that effects of any asymmetries in the Hall sensor, such as structural asymmetries in the Hall plate, on the first signal may be mitigated, thereby improving the accuracy of the first signal. For example, an effect on the first signal measured when the biasing current is directed in a first direction may be inverted when the first signal is measured when the biasing current is directed in a second direction opposite to the first direction. In the art, this technique is often called "current spinning".

For the second Hall sensor, said current spinning is not applied, but instead, a fixed bias is applied. An advantage is that a fast response may be obtained, so that event detection may be fast.

Any features of any embodiment of the fourth aspect may be independently as correspondingly described for any embodiment of the first or second aspect of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference signs refer to the same or analogous elements.

DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the invention therefore also includes as one embodiment that no further components are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Figure 1:
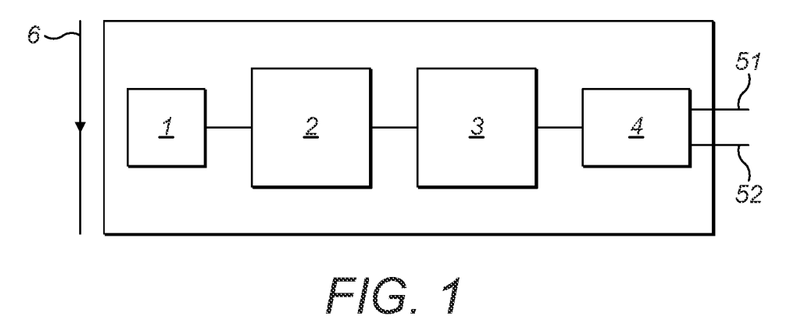
FIG. 1 is a block diagram of a first example of a current sensor device in accordance with embodiments of the present invention.

Reference is made to FIG. 1, which is a block diagram of a first example of a current sensor device in accordance with embodiments of the present invention. In a first aspect, the present invention relates to a current sensor device comprising current sensing means 1 for measuring a current. In this example, the current flows through a conductor 6 that is external to the current sensor device. The current sensor device further comprises amplification means 2 arranged to act in a first state and in a second state. The amplification means 2 in said first state are arranged for amplifying a first signal from said current sensing means with an adjustable first gain and a first bandwidth to yield a first amplified signal. The amplification means 2 in said second state are arranged for amplifying a second signal from said current sensing means with a second gain and a second bandwidth, yielding a second amplified signal. Herein, the first gain is higher than the second gain. The current sensor device further comprises processing means 3 arranged for receiving said first and said second amplified signal, for controlling at least said first gain, for producing a signal indicative of said current based on said first amplified signal, and for detecting an event based on at least said second amplified signal and for producing a signal indicative of said event. The processing means 3 may further be arranged for controlling the bandwidth of the amplification means 2. The current sensor device further comprises an output terminal 4 arranged for outputting said signal indicative of said current, in this example through a first output 51, and an output terminal 4 arranged for outputting said signal indicative of the event, in this example through a second output 52.

Figure 2:
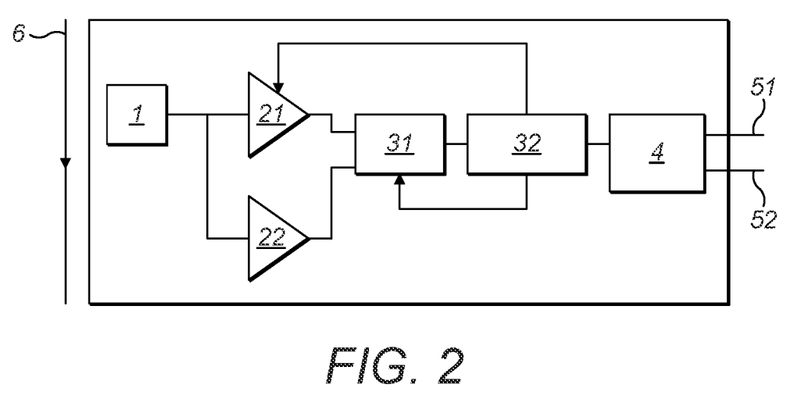
FIG. 2 is a block diagram of a second example of a current sensor device, comprising an analog-to-digital converter, in accordance with embodiments of the present invention.

Reference is made to FIG. 2, which is a block diagram of a second example of a current sensor device in accordance with embodiments of the present invention. In this example, the current sensing means 1 comprises one or more current sensing elements for providing a first signal and a second signal. For example, multiple current sensing elements may have a single, common, output. As such, in this example, the first signal and the second signal are the same, common, signal. In other words, the one or more current sensing elements are arranged such that only a single current sensing means 1 output is generated. Although only a single current sensing element could be used in this case, using more than one current sensing element, interconnected so as to generate the common signal, may have advantages, such as a stronger and/or more accurate signal that is generated, e.g., a better signal-to-noise ratio and/or a lower offset.

In this example, the output signal of the single current sensing means 1, comprising the first and second signal, is split, and inputted in a first amplifier 21, corresponding to a first state of the amplification means, and, separately, in a second amplifier 22, different from the first amplifier 21 and corresponding to a second state of the amplification means. The first amplifier amplifies the signal outputted by the current sensing means 1, e.g., the first signal, with a first gain and a first bandwidth. The second amplifier amplifies the signal outputted by the current sensing means 1, e.g., the second signal, with a second gain and a second bandwidth. The first bandwidth may be the same as the second bandwidth, but it is preferred that the second bandwidth is as high as possible so as to achieve a fast event detection. It may, therefore, be advantageous to use a second bandwidth that is higher than the first bandwidth. The first gain is tuneable, by a processing unit 32 comprised in the processing means, for example, using one of the algorithms mentioned elsewhere in the description. The second gain may also be tuneable, e.g., by the processing unit 32 or by a different means, although the second gain may instead be fixed. However, it is at least possible to set the first gain to a higher value than the second gain, so that also weak currents may be accurately detected, i.e., so that the signal indicative of the current may accurately represent the current that is present on the conductor 6.

In this example, the second current sensor device comprises a switch 31, that has two input ports, for receiving an output from the first amplifier 21, that is the first amplified signal, separately from an output from the second amplifier 22, that is the second amplified signal. The switch 31 has a single output port, and is configured for outputting, through the single output port, either the first amplified signal, or the second amplified signal. Thereby, the processing means may alternatingly receive and possibly process the first amplified signal, and the second amplified signal. As such, in this example, the switch 31 functions as means for time-division multiplexing of the first and second amplified signal.

In this example, the processing unit 32 comprises an analog-to-digital converter. Said analog-to-digital converter converts the first amplified signal to a first digital signal, and the second amplified signal to a second digital signal. The processing unit 32 may determine, based on the first amplified signal it receives, the first gain to which the first amplifier 21 is to be set. For example, the processing unit 32 may change the first gain until a suitable value for the first gain is selected that may result in an accurate determination of the current. In particular, the first gain may be optimized so that the analog-to-digital conversion may result in a first digital signal that accurately represents, i.e., indicates, the current. Said optimization of the first gain may be performed, for example, by using one of the algorithms mentioned elsewhere in the description. Said, digital, signal indicative of the current is subsequently outputted by the output terminal 4, which outputs the signal indicative of the current through a first output 51. The processing unit 32 may furthermore be used to control the switch 31, so as to determine which of the first and second amplified signal is passed by the switch 31.

In this example, when the second amplifier signal is inputted in the processing unit 32 and converted, by the analog-to-digital converter, into the second digital signal, the processing unit 32 detects whether an event, e.g., an overcurrent event, occurred. For example, the second digital signal may be compared with a reference digital signal representative for an event. Herein, the second gain is preferably set such that, when the second digital signal is equal to or greater than the reference digital signal, the second amplified signal, corresponding to the second digital signal, does not saturate the second amplifier 22 or the analog-to-digital converter, so that the event may be accurately determined. The reason is that the reference digital signal, i.e., the overcurrent threshold, usually corresponds to a high current that is, in a typical situation, far above a saturation limit for the first amplified signal. That is, when the first gain and first amplified signal were to be used for detecting the event, and whenever saturation (e.g., of the first amplifier 21 or of the analog-to-digital converter) occurs, it may be unclear whether an event occurred, or whether, instead, the current is rather outside the present scale yet still below the overcurrent threshold, and the first gain is only to be reduced so as to bring the first amplified signal back within scale. An overcurrent, e.g., due to a short-circuit, may occur at any time, even when a low current is being measured based on the first signal. Based on the comparison, the processing unit 32 may produce a signal indicative of said event. Said signal indicative of the event is subsequently outputted by the output terminal 4, which outputs the signal indicative of the event through a second output 52. Herein, the output terminal 4 may comprise output circuitry, such as an output buffer. In this example, the outputted signal indicative of the event may be a digital signal.

In this example, the output terminal 4 is arranged for determining whether the signal inputted in the output terminal 4 is the signal indicative of the current, or the signal indicative of the event, and output each signal through the corresponding output 51 or 52. This may be achieved, for example, by a signal from the processing unit 32. Alternatively, the processing unit may output the signal indicative of the current and the signal indicative of the event to separate output terminals, each connected to a corresponding output 51 or 52.

The signal indicative of said event is not limited to a particular signal scheme. For example, the processing unit 32 may produce a signal only when an event occurred.

Alternatively, the processing unit 32 may produce a signal only when no event occurred. Still alternatively, the processing unit 32 may produce a first signal, e.g., a high signal, when an event occurred, and a second signal, different from the first signal, e.g., a low signal, when no event occurred.

Figure 3:
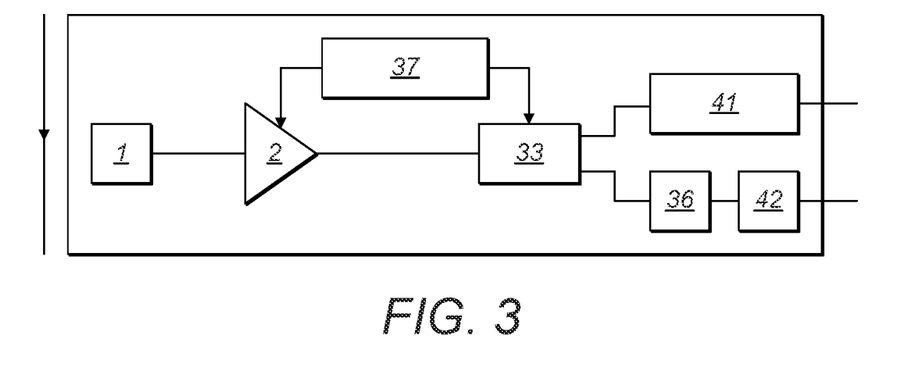
FIG. 3 is a block diagram of a third example of a current sensor device, that is an analog current sensor device, in accordance with embodiments of the present invention.

Reference is made to FIG. 3, which is a block diagram of a third example of a current sensor device in accordance with embodiments of the present invention. Similar as in the second example, the first signal and the second signal are the same signal. In this example, the amplification means comprises a single amplifier 2. The single amplifier 2 is controlled by a controller 37 of the processing means to amplify the signal outputted by the current sensing means 1 by, alternatingly, a first gain and a second gain, i.e., to act in the first state and second state, respectively. As such, the single amplifier 2 produces, alternatingly, a first amplified signal and a second amplified signal. The signal output by the amplifier can be seen as a time-division multiplexed signal of the first and second amplified signal: in one time slot the first amplified signal is outputted and in the next time slot the second amplified signal.

The multiplexed signal is inputted in a switch 33 having a single input, and two outputs: a first output connected to an output terminal 41; and a second output connected to an analog comparator 36. The switch 33 separates the time-division multiplexed signal such that the first amplified signal is outputted through the first output of the switch 33, to the output terminal 41, and such that the second amplified signal is outputted through the second output of the switch 33, to the comparator 36. The output terminal 41 outputs a signal indicative of said current based on said first amplified signal. The signal indicative of said current may comprise said first amplified signal. As said first amplified signal depends on the first gain, it may be preferred to also output a signal indicative of said first gain. For example, the first amplified signal and the signal indicative of the first gain may be time-division multiplexed. Said output terminal 41 may comprise an output buffer, comprising a memory (e.g., a flip-flop) or cache for temporarily storing the signals indicative of said current. The signals may be stored until a readout unit, which may be external to the current sensor device, connected to the output terminal 41, is ready for receiving and/or processing the signals.

The comparator 36 may compare the second amplified signal to a predetermined threshold value (for example, determine whether the amplified signal is greater or equal to the predetermined threshold value), to determine whether an event occurred, and produces, based on said comparison, a signal indicative of the event. An output terminal 42 outputs said signal indicative of the event. The output terminal 42 may comprise an output buffer.

Figure 4:
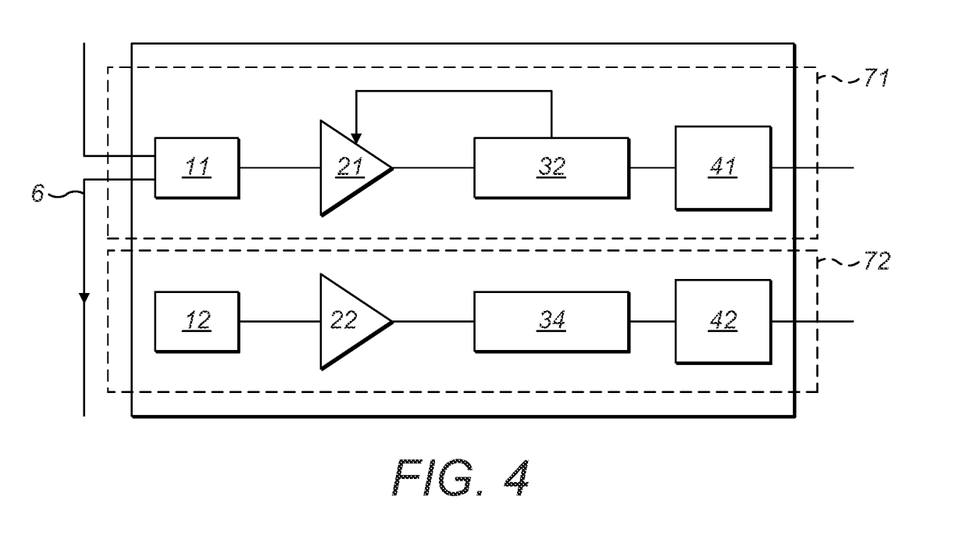
FIG. 4 is a block diagram of a fourth example of a current sensor device, comprising two separate paths for generating the signal indicative of the current, and for generating the signal indicative of the event, in accordance with embodiments of the present invention.

Reference is made to FIG. 4, which is a block diagram of a fourth example of a current sensor device in accordance with embodiments of the present invention. In this example, the current sensor device comprises two separate, parallel paths: a first path 71 dedicated to determining a current, and a second path 72 dedicated to determining whether an event occurred. The use of two separate, parallel paths may be robust and efficient. In this example, the current sensing means comprises two separate current sensors 11 and 12. In this example, the first current sensor 11, that is for generating a first signal, comprises at least one shunt resistor for generating a voltage drop over the conductor 6. Said voltage drop may be detected using a differential amplifier. Based on the resistance of the shunt resistor, and the voltage drop, the current through the conductor 6 may be determined. The shunt resistor may be external to the circuit. In this example, the second current sensor 12, that is for generating a second signal, comprises at least one magnetic sensing element, such as a Hall sensor. In an alternative example, the first current sensor 11 could instead comprise the magnetic sensing element, and the second current sensor 12 could instead comprise the shunt resistor. Still alternatively, both the first 11 and second current sensor 12 may comprise a magnetic sensing element.

In the first path 71, the first signal, generated by the first current sensor 11, is amplified, by a first amplifier 21, with a first gain, that is controlled by a first processing unit 32, thereby generating a first amplified signal. The first amplified signal is inputted in the first processing unit 32. The first processing unit 32 determines the first gain based on the first amplified signal, e.g., using one of the algorithms used elsewhere in the description for optimizing the first gain, and controls the first amplifier 21 so as to amplify the first signal with the first gain. In addition, the first processing unit 32 produces a signal indicative of the current based on the first amplified signal, which is subsequently outputted by an output terminal 41.

In the second path 72, the second signal, generated by the second current sensor 12, is amplified, by a second amplifier 22, with a second gain, thereby generating a second amplified signal. In this example, the second gain is fixed. A second processing unit 34 receives the second amplified signal, and determines, based on the second amplified signal, whether an event occurred. A signal indicated of said event is, then, outputted by an output terminal 42. The second processing unit 34 may comprise an analog comparator, for comparing the second amplified signal to a predetermined reference signal (e.g., voltage reference). Alternatively, the second processing unit 34 may comprise analog-to-digital conversion means and digital comparison means.

Figure 5:
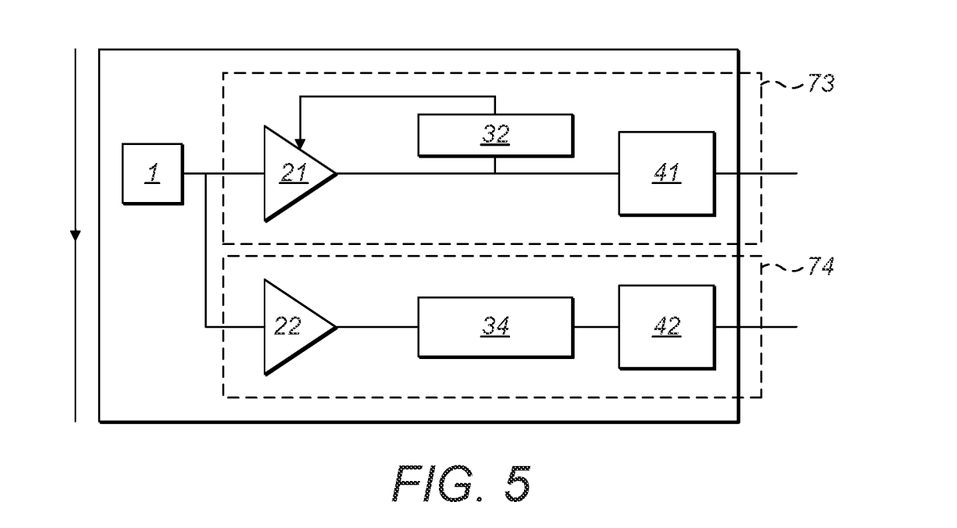
FIG. 5 is a block diagram of a fifth example of a current sensor device, that is an analog current sensor device comprising two separate paths, in accordance with embodiments of the present invention.

Reference is made to FIG. 5, which is a block diagram of a fifth example of a current sensor device in accordance with embodiments of the present invention. A single signal is produced by a current sensing means 1. Said signal is split over two parallel paths: a first path 73 for generating an output signal indicative of said current, and a second path 74 for generating and outputting a signal indicative of an event. inputted into both a first amplifier 21 and a second amplifier 22.

In the first path 73, a first amplified signal generated by the first amplifier 21 is inputted into a first processing unit 32 and into an output terminal 41. As before, said first processing unit 32 determines the first gain based on the first amplified signal, and controls the gain of the first amplifier 21. The output terminal 41 outputs a signal indicative of the current based on the first amplified signal. For example, the first amplified signal itself may be output (possibly after output buffering in the output terminal 41). In such embodiments, preferably, a signal indicative of the first gain is also output. This may be done through the output terminal 41, or through a separate output terminal (not shown). As another example, the part of the processing means intended for determining the first gain (e.g., based on an algorithm as explained above) may be located in a microprocessor that, in addition, determines the current based on the output signal indicative for the current. In that case, said microprocessor may base the determined current on both the output signal indicative of the current, and on the first gain. In that case, no separate output terminal for outputting the first gain is needed, as the first gain may, e.g., be stored in the microprocessor.

Alternatively, the first amplified signal may first be processed, wherein said processing may, for example, comprise filtering and/or clamping and/or adding an offset.

In the second path 74, a second amplified signal generated by the second amplifier 22 is inputted into an analog comparator 34 that compares the second amplified signal with a threshold to determine whether an event occurred, and produces a signal indicative of an event. Instead, however, a digital comparator could be used, comprising an analog-to-digital converter for generating, based on the second amplified signal, a digital signal, and digital circuitry for processing said digital signal. Said signal indicative of the event is subsequently output by an output terminal 42.

In a fourth aspect, the present invention relates to a current sensor device comprising current sensing means for measuring a current, comprising a first Hall sensor and a second Hall sensor. The first Hall sensor is arranged such that a direction of a biasing current applied to a Hall plate of the first Hall sensor for biasing is alternated between at least two different directions. Herein, the readout terminals and the biasing current terminals may also be interchanged, resulting in four possible configurations, wherein the connection may be changed between said four configurations. This corresponds to 4-phase current spinning, as is well-known in the art. A voltage for readout of the first Hall sensor is typically detected in a direction perpendicular to the direction of the applied biasing current. The second Hall sensor is arranged such that two terminals are fixedly used for biasing, and two different terminals are fixedly used for readout. Optionally, the direction of the biasing current may be fixed, for example using a constant voltage source. The current sensor device further comprises amplification means arranged to act in a first state and in a second state. The amplification means in said first state are arranged for amplifying a first signal from the first Hall sensor of said current sensing means with a first gain and a first bandwidth to yield a first amplified signal. The amplification means in said second state are arranged for amplifying a second signal from the second Hall sensor of said current sensing means with a second gain and a second bandwidth, yielding a second amplified signal. The current sensor device further comprises processing means arranged for receiving said first and said second amplified signal, for detecting an event based on at least said second amplified signal and for producing a signal indicative of said event. The current sensor device further comprises an output terminal arranged for outputting a signal indicative of said current based on said first amplified signal, and an output terminal arranged for outputting said signal indicative of the event.

Figure 6:
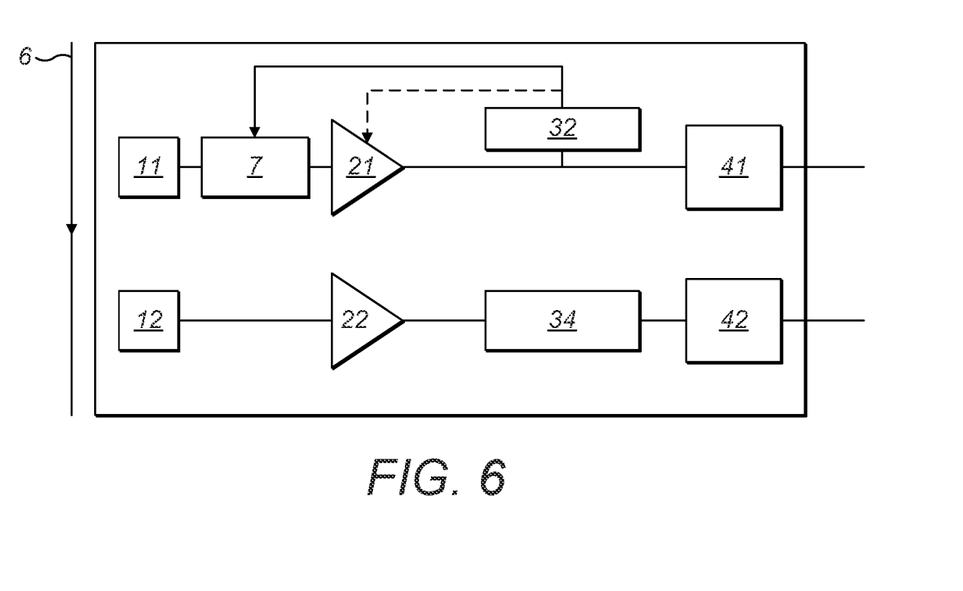
FIG. 6 is a block diagram of a sixth example of a current sensor device, comprising a first Hall sensor making use of current spinning and a second Hall sensor not making use of current spinning, in accordance with embodiments of the present invention.

Reference is made to FIG. 6, which is a block diagram of a sixth example of a current sensor device in accordance with embodiments of the present invention. In this example, the sensing means for measuring a current on a conductor 6 comprises a first Hall sensor 11 for generating a first signal, and a second Hall sensor 12 for generating a second signal, different from the first Hall sensor 11. A switch 7, controlled by a processing unit 32, determines a direction of a biasing current applied through a Hall plate of the first Hall sensor 11. The switch 7 further determines a direction of a voltage for readout of the first Hall sensor 11, that is typically perpendicular to the direction of the biasing current. The switch 7 further selects the terminals of the Hall plate that are connected to the biasing current and for the readout. By alternating the direction, for example by rotating said directions at regular angle intervals (sometimes called "current-spinning" in the field), the first signal generated by the first Hall sensor 11 may be very accurate.

The first signal may be amplified by a first amplifier 21, by a first gain and a first bandwidth, yielding a first amplified signal. The first gain may be tuneable, e.g., by the processing unit 32, but that is not essential for embodiments of the fourth aspect. Instead, the first gain may be fixed. The first amplified signal is subsequently received by output terminal 41, that may comprise an output buffer, for outputting of a signal indicative of the current on the conductor 6, based on said first amplified signal.

The second signal may be amplified by a second amplifier 22, by a second gain and a second bandwidth, yielding a second amplified signal. A direction of the biasing current and a direction of a voltage for readout through a Hall plate of the second Hall sensor 12 is fixed (so that no current-spinning is performed for the second Hall sensor 12). For example, the second Hall sensor 12 is fixedly biased with a voltage source. The second amplified signal generated by the second amplifier 22 is inputted into an analog comparator 34 to determine whether an event occurred, and a signal indicative of said event may be generated and outputted by an output terminal 42. As, in this example, the directions of the biasing and voltage for the second Hall sensor 12 are fixed, no delay on said determination of the event is possible.

An advantage of this scheme is that efficient offset removal may be achieved with respect to the first signal (e.g., due to 2-phase or 4-phase current spinning). At the same time, the second signal may suffer from a large offset, but may be faster, as no processing of the 2 or 4 phases is required.

Although in this example, that is an embodiment of the fourth aspect, the first and second signal are processed in separate, parallel paths, the fourth aspect is not limited thereto. For example, time-division multiplexing, as described in several of the examples of the first aspect, may also be applied in different embodiments of the fourth aspect.

It is to be understood that although preferred embodiments, specific constructions and configurations, as well as materials, have been discussed herein for devices according to the present invention, various changes or modifications in form and detail may be made without departing from the scope of this invention. Functionality may be added or deleted from the block diagrams and operations may be interchanged among functional blocks.

The invention claimed is:

1. A current sensor device for measuring a current in a conductor comprising:
   current sensing means comprising a magnetic sensing element for contactlessly measuring the current,
   amplification means arranged to act in a first state and in a second state, said amplification means in said first state being arranged for amplifying a first signal from said current sensing means with an adjustable first gain and a first bandwidth to yield a first amplified signal, and said amplification means in said second state arranged for amplifying a second signal from said current sensing means with a second gain and a second bandwidth, yielding a second amplified signal, wherein said first gain is higher than the second gain, wherein the first gain and the second gain are larger than 1,
   processing means arranged for receiving said first and said second amplified signal, for controlling at least said first gain, for detecting an event based on at least said second amplified signal and for producing a signal indicative of said event, and
   an output terminal arranged for outputting a signal indicative of said current based on said first amplified signal, and
   an output terminal arranged for outputting said signal indicative of the event, wherein the event is a fault.

2. The current sensor device according to claim 1, wherein the second gain has a fixed, predetermined value.

3. The current sensor device according to claim 1, comprising means for time-division multiplexing the first amplified signal and the second amplified signal.

4. The current sensor device according to claim 1, wherein the fault is an overcurrent event.

5. The current sensor device according to claim 1, wherein the amplification means comprises a first amplifier arranged to act in the first state and a second amplifier, different from the first amplifier, to act in the second state.

6. The current sensor device according to claim 1, wherein a ratio of a voltage of the conductor in which the current is measured to a maximum operation voltage of the current sensor device is at least 2.

7. The current sensor device according to claim 1, wherein the current sensing means comprises one or more current sensing elements for providing said first and second signal, wherein the first and second signal are the same signal.

8. The current sensor device according to claim 1, wherein the current sensing means comprises a first current sensing element and a second current sensing element, different from the first current sensing element, wherein the first current sensing element is for outputting the first signal, and wherein the second current sensing element is for outputting the second signal.

9. The current sensor device according to claim 8, wherein the second current sensing element comprises a Hall sensor, arranged such that two terminals are fixedly used for biasing, and two different terminals are fixedly used for readout.

10. The current sensor device according to claim 1, wherein the processing means comprises at least one analogue-to-digital converter for converting the first and second amplified signal into a first and second digital signal, respectively, and digital signal processing circuitry for the controlling of at least said first gain, for the detecting of the event and for the producing of the signal indicative of said event.

11. The current sensor device according to claim 1, wherein the second bandwidth is higher than the first bandwidth.

12. The current sensor device according to claim 11, wherein a ratio of the second bandwidth to the first bandwidth is at least 2.

13. The current sensor according to claim 11, wherein the ratio of the second bandwidth to the first bandwidth is at least 10.

14. The current sensor device according to claim 11, wherein the ratio of the second bandwidth to the first bandwidth is at least 100.

15. The current sensor device according to claim 1, wherein the processing means comprises a switch, having a first input for receiving the first amplified signal and a second input for receiving the second amplified signal, wherein the switch is arranged for selecting between the first amplified signal and the second amplified signal for outputting from a single output of the switch.

16. The current sensor device according to claim 1, wherein the processing means is arranged for detecting the first amplified signal and for controlling at least said first gain based on the detected first amplified signal.

17. Use of the current sensor device according to claim 1 for monitoring of a current generated by a battery.

* * * * *